(12) United States Patent
Srinivasan et al.

(10) Patent No.: US 10,735,038 B2
(45) Date of Patent: Aug. 4, 2020

(54) ADAPTIVE NFC RECEIVER

(71) Applicant: NXP B.V., Eindhoven (NL)

(72) Inventors: Radha Srinivasan, Irvine, CA (US); Ulrich Andreas Muehlmann, Graz (AT); Frederic Benoist, Saint Paul de Vence (FR); Stefan Mendel, Graz (AT); Steve Charpentier, Antibes (FR)

(73) Assignee: NXP B.V., San Jose, CA (US)

( * ) Notice: Subject to any disclaimer, the term of this patent is extended or adjusted under 35 U.S.C. 154(b) by 128 days.

(21) Appl. No.: 15/907,544

(22) Filed: Feb. 28, 2018

(65) Prior Publication Data
US 2019/0190554 A1    Jun. 20, 2019

(30) Foreign Application Priority Data

Dec. 19, 2017    (EP) ..................................... 17306828

(51) Int. Cl.
  *H04B 1/12*       (2006.01)
  *H04B 17/318*     (2015.01)
  *H04B 5/00*       (2006.01)
  *H03M 1/06*       (2006.01)
  *H03M 1/12*       (2006.01)

(52) U.S. Cl.
  CPC ............ *H04B 1/12* (2013.01); *H03M 1/0604* (2013.01); *H04B 5/0056* (2013.01); *H04B 17/318* (2015.01); *H03M 1/0609* (2013.01); *H03M 1/12* (2013.01); *H04B 5/00* (2013.01)

(58) Field of Classification Search
  CPC ...... H04B 1/12; H04B 17/318; H04B 5/0056; H04B 5/00; H04M 1/0604; H04M 1/0609; H04M 1/12
  See application file for complete search history.

(56) References Cited

U.S. PATENT DOCUMENTS

| 7,319,852 B2 | 1/2008 | Schlegel et al. |
| 9,264,280 B1 | 2/2016 | Waheed et al. |
| 2010/0075624 A1* | 3/2010 | Shanan .................... H04B 1/30 455/253.2 |
| 2015/0303904 A1* | 10/2015 | Senaratne ............ H03G 3/3078 327/307 |

FOREIGN PATENT DOCUMENTS

| WO | 03088606 A2 | 10/2003 |
| WO | 2003088606 A3 | 10/2003 |

* cited by examiner

*Primary Examiner* — Yuwen Pan
*Assistant Examiner* — Angelica M Perez

(57) ABSTRACT

Embodiments are provided for a method of operating a receiver system, the receiver system comprising one or more channels, the method comprising: monitoring a residual DC (direct current) offset in a present channel by sampling an output of an analog-to-digital converter (ADC) of the present channel; adjusting a DCO (direct current offset) correction signal that corresponds to the residual DC offset in response to an absolute value of the residual DC offset exceeding a programmable DCO threshold; and subtracting the DCO correction signal from an analog signal provided to the ADC to reduce the residual DC offset below the programmable DCO threshold.

15 Claims, 7 Drawing Sheets

ADAPTIVE NFC RECEIVER

BACKGROUND

Field

This disclosure relates generally to gain control of a receiver, and more specifically, to adaptive gain and DC control in response to changing carrier amplitude and load modulation amplitude.

Related Art

Near field communication (NFC) systems are used in a variety of applications, such as tracking objects or products in a supply chain or product delivery chain. A conventional NFC system includes a tag attached to an object and a reader. The reader includes a transmitter for transmitting an interrogation signal to the tag and a receiver for receiving a response signal from the tag. The tag stores identification data for the object, and includes the identification data in its response signal, allowing the object to be identified by the reader.

BRIEF DESCRIPTION OF THE DRAWINGS

The present invention may be better understood, and its numerous objects, features, and advantages made apparent to those skilled in the art by referencing the accompanying drawings.

The present invention is illustrated by way of example and is not limited by the accompanying figures, in which like references indicate similar elements, unless otherwise noted. Elements in the figures are illustrated for simplicity and clarity and have not necessarily been drawn to scale.

DETAILED DESCRIPTION

Figure 1:
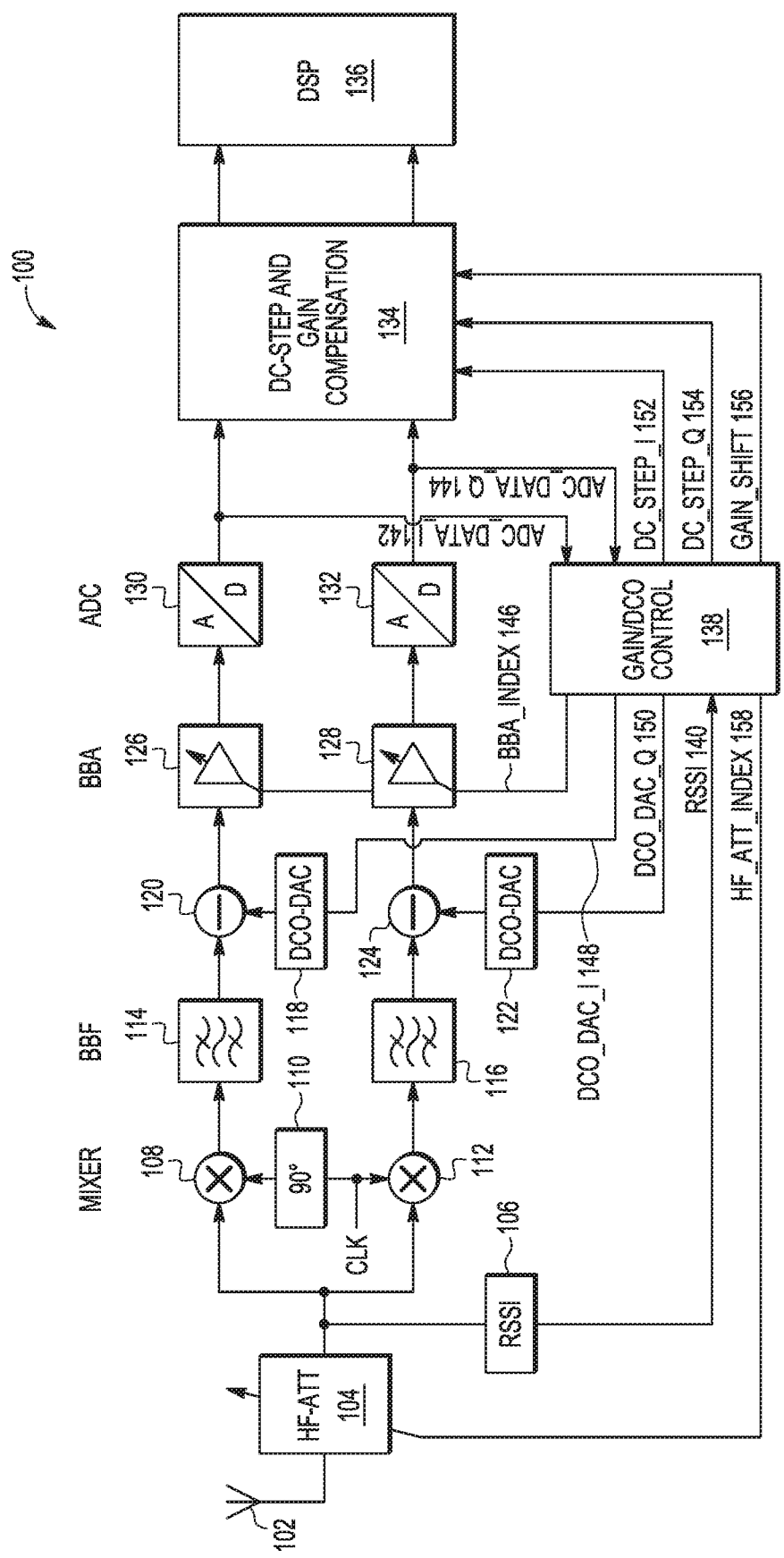
FIG. 1 is a block diagram depicting an example receiver system that implements an adaptive gain and DC control solution according to some embodiments of the present disclosure.

The following sets forth a detailed description of various embodiments intended to be illustrative of the invention and should not be taken to be limiting.

Overview

Typically, the receiver in a near field communication (NFC) reader includes a programmable gain amplifier and attenuator stage and an analog-to-digital converter (ADC) of a reasonable dynamic range, which are designed to support a large input dynamic range. However, the amplifier and attenuator stage should also be controlled to keep an input signal provided to the ADC within a desired range such that the resulting digital signal output by the ADC has the minimum required signal-to-noise ratio (SNR). In NFC applications where a reader and a tag are magnetically coupled, the distance between a tag and a reader could change at the rate of 0.5 m/s, thereby causing the received carrier amplitude to change drastically due to change in the coupling factor. The inability of the reader receiver to adapt to the changing carrier amplitude in a dynamic coupling scenario may result in data loss or erroneous reception, especially when long frames of data are being received.

The present disclosure provides an adaptive gain and DC (direct current) control solution implemented in a receiver, which tracks changes of a carrier amplitude and adapts settings of the receiver while waiting for reception of a frame (e.g., before detection of a start of frame (SOF) delimiter or a preamble), such as by adjusting an attenuation setting or a DC offset correction setting. The solution also tracks changes in load modulation amplitude and adapts settings of the receiver during frame reception (e.g., after valid SOF or preamble detection), such as by adjusting a DC offset correction setting or a gain setting. The solution provides robust reception in a dynamic coupling scenario by maximizing the dynamic range and sensitivity.

In some embodiments, control circuitry that implements the adaptive gain and DC control solution is configured to control a high frequency (HF) attenuator based on received signal strength indicator (RSSI) measured at the output of the HF attenuator. The HF attenuator is used to attenuate strong radio frequency (RF) signals received at the antenna, where the variable attenuation setting is programmed when the receiver is initialized (e.g., at startup or reset) and adjusted as needed to maintain the RSSI within a desired target range while the receiver waits for a frame to be received, and is not adjusted while the receiver is receiving a valid frame.

In some embodiments, control circuitry that implements the adaptive gain and DC control solution is configured to control DC offset (DCO) correction of I and Q channels of the receiver based on signal level. When an RF input signal is down converted in the receiver using the carrier signal frequency, a DC (direct current) offset may be generated that is proportional to the carrier amplitude, where the DC offset may have a different magnitude in the I channel than in the Q channel. The control circuitry is configured to estimate the DC offset in each I and Q channel at the output of the ADCs of the I and Q channels, and independently controls DCO correction circuitry to output respective DCO correction signals to remove or cancel out the respective DC offsets. Since a residual DC offset may remain in each I and Q channel, the control circuitry adjusts the DCO correction signals as needed to maintain the residual DC offset below a desired minimum threshold, while the receiver waits for a frame to be received, as well as while the receiver is receiving a valid frame. The DCO correction signals are programmed after the HF attenuator at initialization of the receiver, and may be further adjusted after each adjustment of the HF attenuator.

In some embodiments, control circuitry that implements the adaptive gain and DC control solution is configured to control baseband amplifier (BBA) gain based on signal level. If the signal level of either the I or Q channel exceeds a maximum threshold while the receiver is waiting for a frame to be received, the variable gain setting for both I and Q channels is adjusted to reduce the signal level and avoid clipping. The control circuitry may be configured to adjust the gain setting for both I and Q channels to maintain the signal level within a desired target range while a frame is being received.

In some embodiments, control circuitry that implements the adaptive gain and DC control solution is configured to implement digital compensation in the digital I and Q signals. The solution digitally compensates the signal, such as by adding a DC compensation signal to smooth any abrupt transitions in the signal caused by changing a DC offset correction setting, or by scaling the signal to counter any changes in the signal amplitude caused by changing a gain setting.

EXAMPLE EMBODIMENTS

FIG. 1 is a block diagram depicting an example receiver system 100 that implements an adaptive gain and DC control solution. Although a number of components are illustrated in a particular arrangement in FIG. 1, receiver system 100 may include additional or fewer components, and the receiver components may have a different arrangement than that shown. While a single-ended configuration of the receiver system 100 is shown, the receiver system 100 may implement a differential signal configuration in other embodiments.

Receiver system 100 includes an antenna 102 coupled to an analog front-end architecture, which includes a programmable high frequency (HF) attenuator 104, received signal strength indicator (RSSI) circuit 106, mixers 108 and 112, base-band filters (BBF) 114 and 116, DC (direct current) offset digital-to-analog converters (DCO-DAC) 118 and 222, and programmable base-band amplifiers (BBA) 126 and 128. The analog front-end architecture is coupled to analog-to-digital converters (ADC) 130 and 132, which in turn are coupled to a digital signal processor (DSP) 136. Receiver system 100 also includes an adaptive gain and DC offset (DCO) control circuitry (Gain/DCO control) 138 and a DC step and gain compensation unit (Compensation Unit) 134 to implement the adaptive gain and DC control solution. Each of the receiver components are implemented, at least in part, as circuitry. The receiver components are further discussed below.

The antenna 102 is configured to receive radio frequency (RF) signals generated using a carrier signal having a known frequency, where the frequency of received RF signals may generally fall in a range of 20 kHz to 300 GHz. In some embodiments, the frequency of received RF signals falls in a range centered on 13.56 MHz (e.g., using a 13.56 MHz carrier signal). In other embodiments, the frequency of received RF signals falls in a range of 120 kHz to 10 GHz, or in a range of 856 to 960 MHz. In some embodiments, the antenna 102 may include impedance matching components (not shown) to match the single-ended impedance of the antenna 102 to the input impedance of the analog front-end architecture. In some embodiments, the antenna 102 may include a balun or similar device to produce a negative voltage signal and a positive voltage signal of equal magnitude to transform the single-ended antenna signal into a differential voltage signal.

An RF input signal (e.g., single-ended or differential) is provided by antenna 102 to the HF attenuator 104, which is configured to attenuate or reduce the signal strength of the input signal based on a programmable attenuation that is set by an attenuator control signal hf_att_index 158. The output of the HF attenuator 104 is provided to RSSI circuit 106, which is configured to calculate the signal strength of the input signal, also referred to as RSSI (received signal strength indicator) 140. RSSI 140 corresponds to the carrier signal amplitude of the RF input signal, which may change depending on the distance between the receiver system 100 and the tag that provides the RF input signal. RSSI 140 is provided to Gain/DCO control 138, which is configured to monitor or track the carrier signal amplitude, such as by monitoring the value of the RSSI 140. Gain/DCO control 138 is also configured to adjust (e.g., increase or decrease) the programmable attenuation of HF attenuator 104 as needed to maintain the RSSI 140 within a desired range by adjusting control signal hf_att_index 158, as further discussed below.

The output of the HF attenuator 104 is also provided to a first mixer 108 on an in-phase signal channel (I channel) shown as the top path or branch of the receiver system 100, and to a second mixer 112 on a quadrature signal channel (Q channel) shown as the bottom path or branch of the receiver system 100. Mixer 108 is configured to downmix or downconvert the RF input signal with a first oscillator signal to produce an I signal in the baseband, and mixer 112 is configured to downmix or down convert the RF input signal with a second oscillator signal to produce a Q signal in the baseband, where the I and Q signals output by mixer 108 and mixer 112 differ in phase by 90 degrees. In the embodiment shown, a clock signal (labeled as clk) is used as the second oscillator signal and a 90 degree phase delay is introduced by phase delay component 110 to produce the first oscillator signal, although other approaches may be used to provide the first and second oscillator signals that differ in phase by 90 degrees in other embodiments. In the embodiment shown, the first and second oscillator signals have a frequency equal to the carrier signal frequency. The carrier signal frequency may be equal to 13.56 MHz in some embodiments, or may fall in a range such as 120 kHz to 10 GHz or in a range of 856 to 960 MHz in other embodiments.

The output of mixers 108 and 112 are respectively provided to BBF 114 and 116, which respectively output a filtered I signal and a filtered Q signal. BBF 114 and 116 are each configured to pass signals having a frequency inside of a configured frequency interval of (0, B), where B is the cutoff frequency of the baseband filter. The cutoff frequencies of BBF 114 and 116 are set to allow for signals within a desirable frequency bandwidth of the I channel and the Q channel, respectively, to propagate to ADCs 130 and 132.

Any DC offset in the I and Q channels resulting from the down conversion by mixers 108 and 112 may also propagate to ADCs 130 and 132. The DC offset is proportional to the carrier signal amplitude after down conversion, and a first DC offset in the I channel may have a magnitude that is different than the magnitude of a second DC offset in the Q channel. Gain/DCO control 138 is configured to monitor or track a DC offset present in each of the I and Q channels at the output of the ADCs 130 and 132 (respectively labeled as signals adc_data_i 142 and adc_data_q 144) for DC offset correction. Gain/DCO control 138 may be configured to estimate a first DC offset in the I channel by calculating a mean value of the signal adc_data_i 142, such as by averaging a number of ADC samples at the output of the ADC 130. Gain/DCO control 138 may similarly estimate a second DC offset in the Q channel by calculating a mean value of the signal adc_data_q 144, such as by averaging a same number of ADC samples at the output of the ADC 132. The number of ADC samples is a programmable integer value.

DC offset correction is implemented by subtractors 120 and 124 and DCO-DACs 118 and 122, where subtractor 120 and DCO-DAC 118 form DCO correction circuitry for the I channel and subtractor 124 and DCO-DAC 122 form DCO correction circuitry for the Q channel. Subtractor 120 receives the filtered I signal from BBF 114 and a first DC offset (DCO) correction signal from DCO-DAC 118, and subtractor 124 receives the filtered Q signal from BBF 116 and a second DCO correction signal from DCO-DAC 122. The first and second DCO correction signals are analog signals that respectively correspond to the first and second DC offsets in the I and Q channels, as estimated by Gain/DCO control 138. Subtractor 120 is configured to subtract the first DCO correction signal from the filtered I signal to remove (or at least reduce) the first DC offset and produce a corrected I signal. Similarly, subtractor 124 is configured to subtract the second DCO correction signal from the filtered Q signal to remove (or at least reduce) the second DC offset and produce a corrected Q signal. The I and Q channels may each still include some residual DC offset at the output of ADCs 130 and 132, depending on how well the first and second DCO correction signals match or cancel out the respective DC offsets in the I and Q channels. Gain/DCO control 138 is configured to independently adjust (e.g., increase or decrease) the first and second DCO correction signals as needed to maintain a residual first DC offset in the I channel and a second residual DC offset in the Q channel within a desired minimum range by independently adjusting the control signals dco_dac_i 148 and dco_dac_q 150, as further discussed below. For comparison's sake, conventional receivers often use high pass filters to remove the DC offsets from the I and Q channels. However, high pass filters often distort the signal and require a settling time that makes start-of-frame (SOF) and end-of-frame (EOF) detection difficult. Such difficulties are avoided by using subtractors 120 and 124 and DCO-DACs 118 and 122 for DC offset correction.

The output of subtractors 120 and 124 are respectively provided to BBA 126 and 128, which are each configured to output an amplified signal proportional to the received signal based on a programmable gain set by gain control signal bba_index 146. BBA 126 is configured to output an amplified I signal and BBA 128 is configured to output an amplified Q signal. The output of BBA 126 and 128 are respectively provided to ADCs 130 and 132, which are each configured to output a digital signal that represents the received signal. ADC 130 outputs a digital I signal and ADC 132 outputs a digital Q signal, respectively labeled as signals adc_data_i 142 and adc_data_q 144.

Gain/DCO control 138 is configured to monitor or track load modulation amplitude at the output of the ADCs 130 and 132, such as by calculating a respective swing value for the I and Q channels based on respective average maximum values and average minimum values of the signals adc_data_i 142 and adc_data_q 144. Gain/DCO control 138 is configured to adjust (e.g., increase or decrease) the programmable gain of BBA 126 and 128 as needed to maintain the swing within a desired range by adjusting control signal bba_index 146, as further discussed below. Gain/DCO control 138 may also use the average maximum and minimum values to determine respective mean values of the signals adc_data_i 142 and adc_data_q 144, which provide another estimation of the first and second residual DC offsets in the I and Q channels. Gain/DCO control 138 may further adjust (e.g., increase or decrease) the first and second DCO correction signals as needed to maintain the first and second residual DC offsets within a desired minimum range by independently adjusting dco_dac_i 148 and dco_dac_q 150, as further discussed below.

The digital I and Q signals adc_data_i 142 and adc_data_q 144 are also provided to a DC step and gain compensation unit 134. Any adjustments made to the settings of the DCO-DACs 118 and 122 or BBAs 126 and 128 may cause abrupt transitions to the residual DC offset or amplitude in the digital I and Q signals. DC step and gain compensation unit 134 is configured to smooth out these transitions and digitally compensate the signals based on control signals dc_step_i 152, dc_step_q 154, and gain_shift 156 provided by Gain/DCO control 138, as further discussed below. The compensated digital I and Q signals are available for further digital processing by DSP 136, such as to extract data from the I and Q signals (e.g., identification data from the tag).

Figure 2:
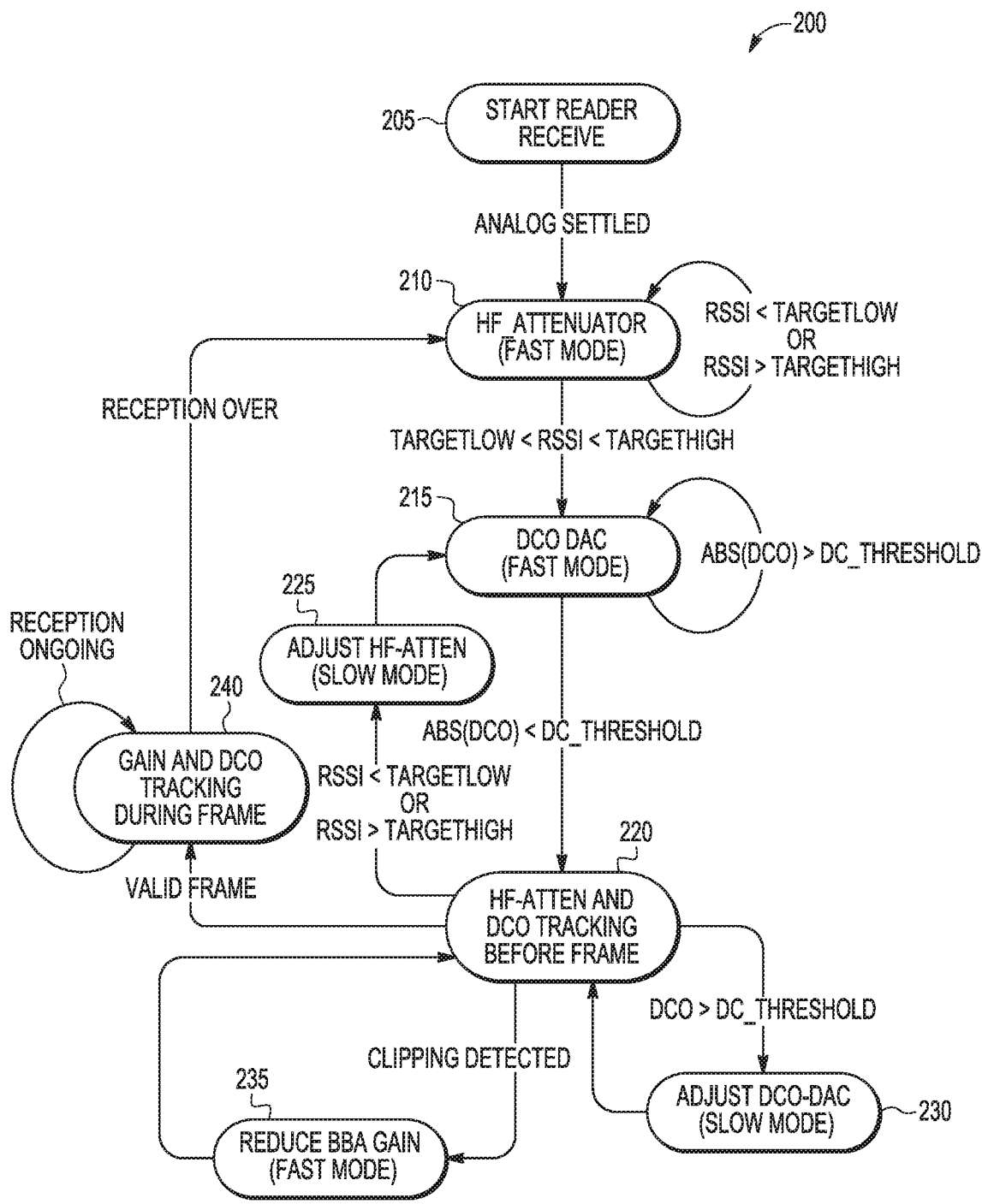
FIG. 2 is an example state diagram for the adaptive gain and DC control solution according to some embodiments of the present disclosure.

FIG. 2 is an example state diagram 200 for the adaptive gain and DC control solution, which may be implemented by Gain/DCO control 138 in some embodiments. Each state transition is illustrated by an arrow, where a state transition occurs when a transition condition is met. Each transition condition is based on one or more detection signals received by Gain/DCO control 138. While Gain/DCO control 138 is configured to monitor and control programmable settings of HF attenuator 104, DCO-DACs 118 and 122, and BBAs 126 and 128 in the embodiments discussed herein, it is noted that the teachings of the present disclosure may be applicable to additional or fewer stages of the receiver using a similar approach in other embodiments.

On start up or reset of the receiver system 100, Gain/DCO control 138 enters Start Reader Receive state 205, where components of the receiver are initialized. Gain/DCO control 138 initializes the HF attenuator 104 to its maximum attenuation level to prevent saturation of the analog front-end architecture. HF attenuator 104 is configured to attenuate an RF input signal by a selected attenuation level out of a plurality of attenuation levels. Each attenuation level corresponds to an N-bit attenuation code, where N is an integer greater than 1. The plurality of N-bit attenuation codes range from a minimum attenuation code (e.g., 0) that corresponds to a minimum attenuation level (e.g., 0 dB) to a maximum attenuation code (e.g., $2^N-1$) that corresponds to a maximum attenuation level (e.g., 60 dB). Control signal hf_att_index 158 indicates the selected attenuation code, which is the attenuation setting of the HF attenuator 104.

In state 205, Gain/DCO control 138 also initializes the DCO-DACs 118 and 122 to output zero. DCO-DACs 118 and 122 are each configured to output an analog signal having a magnitude that corresponds to a selected N-bit input code out of a plurality of N-bit input codes, where N is an integer greater than 1. The plurality of input codes range from a minimum input code (e.g., 0) that corresponds to a minimum analog signal (e.g., a signal having a magnitude of 0 or a maximum negative magnitude) to a maximum input code (e.g., $2^N-1$) that corresponds to a maximum analog signal (e.g., a signal having a maximum positive magnitude), where the maximum magnitude (e.g., positive or negative) output by the DCO-DAC should be comparable to the maximum DC offset (e.g., positive or negative) expected in the receiver. In some embodiments, the difference in the magnitude of the output analog signal between each input code may be pre-programmed into the DCO-DACs to achieve larger steps, as compared with the true resolution capability of the DCO-DAC. For example, a 10 bit DAC may be used, where the range of output signal magnitude is comparable to a range achieved by a DAC that uses a larger bit code, such as a 16 bit DAC. Control signals dco_dac_i 148 and dco_dac_q 150 each respectively indicate the selected input code for DCO-DAC 118 and 122, which is the respective DCO correction setting for DCO-DACs 118 and 122.

In state 205, Gain/DCO control 138 also initializes the BBAs 126 and 128 to their maximum gain level. In the embodiments shown, both BBA 126 and 128 receive a same control signal bba_index 146, where BBA 126 and 128 have a same (or substantially similar) programmable gain. BBA 126 and 128 are each configured to output an amplified signal proportional to a received signal based on a selected gain level out of a plurality of gain levels. Each gain level corresponds to an N-bit gain code, where N is an integer greater than 1. The plurality of N-bit gain codes range from a minimum gain code (e.g., 0) that corresponds to a minimum gain level (e.g., 0 dB) to a maximum gain code (e.g., $2^N-1$) that corresponds to a maximum gain level (e.g., 30 dB). Control signal bba_index 146 indicates the selected gain code, which is the gain setting of both BBA 126 and 128 in the embodiments discussed herein.

Once the analog transients in the receiver have settled, Gain/DCO control 138 transitions from state 205 to HF Attenuator (Fast Mode) state 210 to adjust the (initial) setting of the HF attenuator 104. In state 210, the attenuator level or code is iteratively adjusted until the RSSI 140 is within a desired target range, defined by a programmable floor threshold (or TargetLow) and a programmable ceiling threshold (or TargetHigh). For example, since HF attenuator 104 is initialized at a maximum attenuation level on startup, the RSSI 140 will likely fall below TargetLow. In response, Gain/DCO control 138 incrementally decreases the attenuation level until the RSSI 140 exceeds TargetLow. Similarly, if the RSSI 140 exceeds TargetHigh, Gain/DCO control 138 incrementally increases the attenuation level until the RSSI 140 falls below TargetHigh. State 210 is further discussed below in connection with FIG. 3.

When RSSI 140 falls in the desired target range between TargetLow and TargetHigh, Gain/DCO control 138 transitions from state 210 to DCO-DAC (Fast Mode) state 215 to independently adjust the (initial) settings of the DCO-DACs 118 and 122. In state 215, the input codes for DCO-DACs 118 and 122 are iteratively adjusted until the absolute value of a residual DC offset in the I and Q channels is less than a programmable minimum threshold (or DC_Threshold). For example, since DCO-DACs 118 and 122 are initialized at zero on startup, the DC offset in the I and Q channels is not corrected and propagates at full value to ADCs 130 and 132, which will likely exceed DC_Threshold. In response, Gain/DCO control 138 incrementally increases the input code to DCO-DAC 118 (which outputs a corresponding DCO correction signal) until the absolute value of the residual DC offset at the output of ADC 130 falls below DC_Threshold, and incrementally increases the input code to DCO-DAC 122 (which outputs a corresponding DCO correction signal) until the residual DC offset at the output of ADC 132 falls below DC_Threshold. State 215 is further discussed below in connection with FIG. 4.

When the absolute value of the residual DC offsets of both the I and Q channels are less than DC_Threshold, Gain/DCO control 138 transitions from state 215 to HF Attenuator and DCO Tracking Before Frame state 220 to monitor or track various aspects of the receiver and adjust receiver settings, as needed. In state 220, Gain/DCO control 138 waits for detection of a valid frame by the receiver. A receive sequence is triggered by receipt of an RF signal on the antenna 102, and the receiver evaluates the RF signal to determine whether a valid start-of-frame (SOF) or preamble has been received. If a valid SOF or preamble is received, the receiver has successfully detected that a valid frame is about to be received and indicates this detection to Gain/DCO control 138. While Gain/DCO control 138 waits for a valid frame to be detected in state 220, Gain/DCO control 138 is configured to monitor RSSI 140, the residual DC offsets of the I and Q channels, and the signal levels of the I and Q channels on an on-going or continuous basis. Based on the monitored signals, Gain/DCO control 138 may enter state 225 to adjust the attenuation code for HF attenuator 104 to maintain RSSI within the desired target range between TargetLow and TargetHigh, may enter state 230 to adjust the input codes for DCO-DACs 118 and 122 to maintain the residual DC offset below DC_Threshold, and may enter state 235 to adjust the gain code for BBA 126 and 128 to avoid signal clipping.

In state 225, Gain/DCO control 138 adjusts the attenuator code when RSSI 140 falls outside of the desired target range between TargetLow and TargetHigh. However, it is not desirable to change the attenuator code at a point close in time to receipt of the response signal, where such an adjustment may distort the response signal and cause data loss even as the receiver tries to readjust the attenuation code. To avoid this scenario, Gain/DCO control 138 includes a control block that generates a freeze signal associated with the HF attenuator 104, which indicates when the attenuation code may be adjusted or updated while the receiver waits for detection of a valid frame. In the embodiments discussed herein, the attenuation code may be changed when the freeze signal is logic low. The freeze signal may be generated based on a settle time required after each attenuation code adjustment, where the freeze signal remains at logic high during the settle time, indicating that no further adjustments to the attenuation code are allowed during the settle time. In some embodiments, the freeze signal may also be generated based on the latency of response signal detection after a reader command is transmitted or may also be generated based on a bit grid computed using the last transmitted pause (such as when using a Manchester coding scheme), where the freeze signal remains at logic high during a period of time when the response signal is expected to be received. The latency of response signal detection and the bit grid estimation may be monitored by one or more control blocks in Gain/DCO control 138. After the attenuation code is adjusted (e.g., a single adjustment is made in Slow Mode state 225, compared with multiple iterative adjustments made in Fast Mode state 210), Gain/DCO control 138 transitions to state 215 to further adjust the input codes for the DCO-DACs 118 and 122, if needed, to correct any change in the residual DC offsets that may have occurred due to the attenuation code adjustment. State 225 is further discussed below in connection with FIG. 5.

In state 230, Gain/DCO control 138 independently adjusts the input codes for DCO-DACs 118 and 122 when the absolute value of the residual DC offset of either the I or Q channels exceeds DC_Threshold. For example, Gain/DCO control 138 may adjust (e.g., increase or decrease) the input code to DCO-DAC 118 and the input code to DCO-DAC 122 (each of which outputs a corresponding DCO correction signal) to minimize the residual DC offset. After one input code or both input codes are adjusted (e.g., a single adjustment for DCO-DAC 118 and a single adjustment for DCO-DAC 122 is made in Slow Mode state 230, compared with multiple iterative adjustments made for each DCO-DAC 118 and 122 in Fast Mode state 215), Gain/DCO control 138 transitions back to state 220 to continue tracking. State 230 is further discussed at the end of the discussion of FIG. 4.

In state 235, Gain/DCO control 138 adjusts the gain code for BBA 126 and 128 when clipping of the signal level is detected. Gain/DCO control 138 may include a sub-carrier correlator that continuously monitors the presence of a sub-carrier at the output of ADCs 130 and 132, where clipping is detected when the correlator output exceeds a programmable clipping threshold. When the programmable clipping threshold is exceeded, Gain/DCO control 138 decrements the present gain code by some adjustment step size to reduce the gain setting at BBA 126 and 128. The adjustment step size is a programmable integer value equal to or greater than one. In some embodiments, an appropriate adjustment step size may be selected from a number of adjustment step sizes based on one or more thresholds defined at various gain levels or codes. The number of thresholds, the threshold levels, and the adjustment step sizes are all programmable values, and may be chosen to reduce the number of iterations required to reduce the gain and avoid signal clipping.

When a valid frame is detected (e.g., a start-of-frame (SOF) or preamble is detected by the receiver), Gain/DCO control 138 transitions from state 220 to Gain and DCO Tracking During Frame state 240 to monitor or track various aspects of the receiver and adjust receiver settings, as needed. In state 240, Gain/DCO control 138 is configured to monitor the residual DC offsets of the I and Q channels and the signal levels of the I and Q channels on an on-going or continuous basis, while the receiver is receiving the frame. Based on the monitored signals, Gain/DCO control 138 may adjust the input codes for DCO-DACs 118 and 122 to maintain the residual DC offset below DC_Threshold, and may adjust the gain code for BBA 126 and 128 to maintain the signal level within a desired target range for proper decoding. State 240 is further discussed below in connection with FIG. 6.

Also during state 240, Gain/DCO control 138 is configured to provide control signals to Compensation Unit 134, which implements digital compensation for the I and Q channels. When the input codes for the DCO-DACs 118 and 122 are adjusted, the resulting change in the DCO correction signals causes an abrupt transition in the residual DC offset at the output of ADCs 130 and 132, which may degrade demodulator performance. Also, when the gain code for the BBAs 126 and 128 are adjusted, the resulting change in the BBA gain causes a change in the signal amplitude at the output of ADCs 130 and 132, which may degrade demodulator performance. Gain/DCO control 138 is configured to provide information about these adjustments to Compensation Unit 134, which is configured to compensate the digital I and Q signals to smooth out any abrupt transitions and maintain the signal amplitude within a desired range for proper demodulation. Compensation Unit 134 is further discussed below in connection with FIG. 7.

After reception of the frame is complete, Gain/DCO control 138 returns to state 210 to further adjust the setting of HF attenuator 104, if needed, since the RSSI may have deviated from its target range while the frame was being received during state 240. Gain/DCO control 138 may continue transitioning through the above-described states, tracking various aspects of the receiver, as the receiver alternately waits for receipt of a valid frame and then receives the valid frame.

Figure 3:
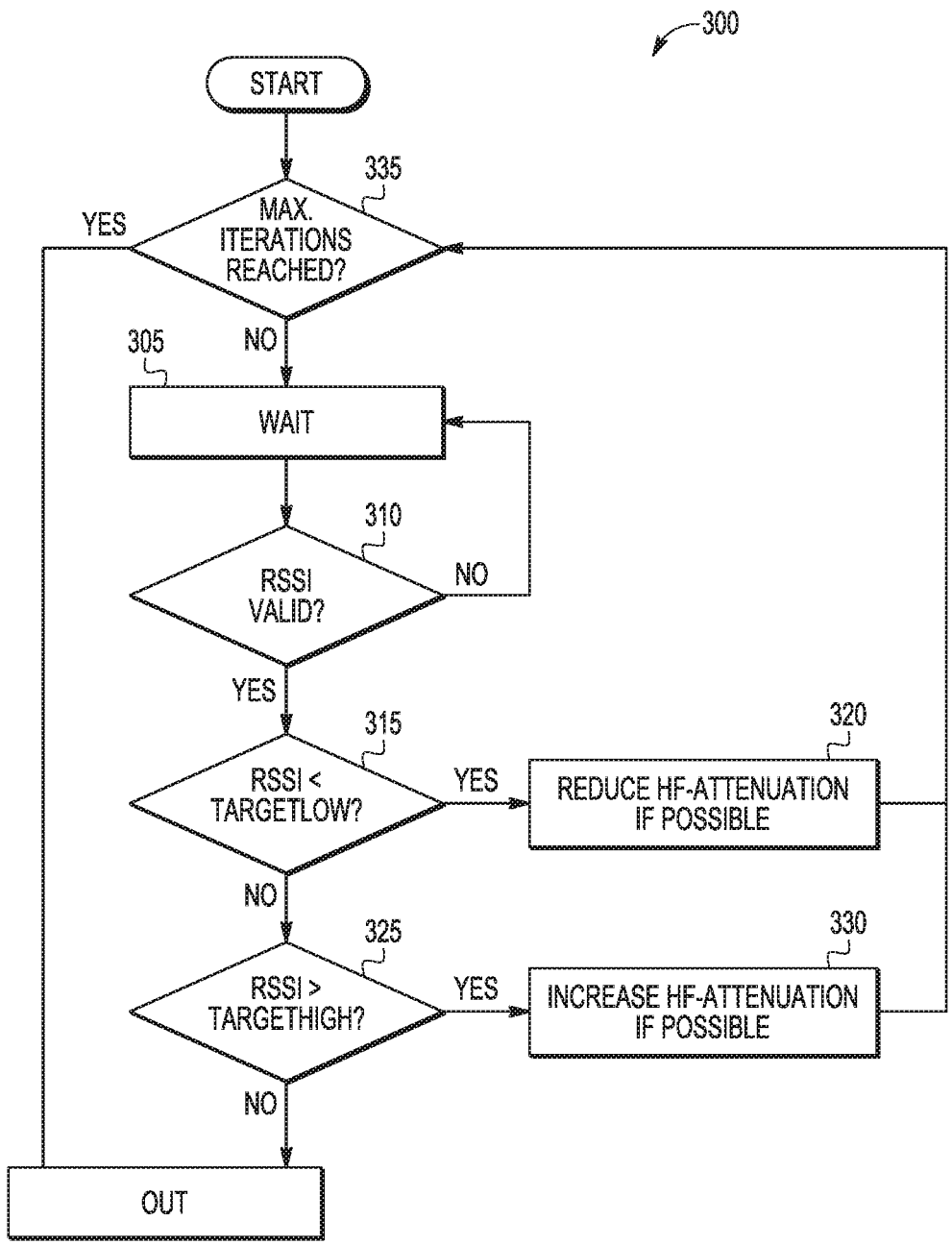
FIG. 3-6 are flowcharts depicting various processes implemented by the adaptive gain and DC control solution according to some embodiments of the present disclosure.

FIG. 3 shows an example process flowchart 300 for HF attenuator (fast mode) state 210 for adjusting an attenuation code for HF attenuator 104. An iteration counter may be initialized to zero before beginning the process 300 (e.g., on startup or reset of the receiver). The process begins at operation 335, where Gain/DCO control 138 determines whether a maximum number of iterations of executing the process shown in FIG. 3 has been reached, such as by comparing a present value of the iteration counter with a programmable maximum value. If so, the process then ends. If not, the process continues to operation 305 where Gain/DCO control 138 waits for a settle time or other amount of time, ignoring the first few RSSI readings. The process continues to operation 310, where Gain/DCO control 138 determines whether RSSI reading is a valid reading. In some embodiments, Gain/DCO control 138 averages an X number of samples of RSSI 140 to calculate the RSSI reading, where X is a programmable integer value.

If the RSSI reading is not valid (e.g., fewer than the X number of RSSI samples have been averaged), the process returns to operation 305 to continue to wait again for the settle time as the proper number of RSSI samples are averaged to produce the RSSI reading. If the RSSI reading is a valid reading (e.g., the proper number of X samples have been averaged), the process continues to operation 315, where Gain/DCO control 138 determines whether the RSSI reading falls below TargetLow, which is a programmable floor threshold. If so, the process continues to operation 320, where Gain/DCO control 138 reduces the attenuation level of HF attenuator 104 by an adjustment step size, if possible. For example, if the attenuation level is already at a minimum attenuation level, the attenuation level cannot be further reduced. Otherwise, the attenuation level may be reduced by decrementing the attenuation code by the adjustment step size (e.g., 1 or 5), which is a programmable integer value. The iteration counter is incremented by one and the process then returns to operation 335 to check if the maximum number of iterations has been reached.

Returning to operation 315, if the RSSI reading does not fall below TargetLow, the process continues to operation 325, where Gain/DCO control 138 determines whether the RSSI reading exceeds TargetHigh, which is a programmable ceiling threshold. If so, the process continues to operation 330, where Gain/DCO control 138 increases the attenuation level of HF attenuator 104 by the adjustment step size, if possible. For example, if the attenuation level is already at a maximum attenuation level, the attenuation level cannot be further increased. Otherwise, the attenuation level may be increased by incrementing the attenuation code by the adjustment step size (e.g., 1 or 5). The iteration counter is incremented by one and the process then returns to operation 335 to check if the maximum number of iterations has been reached. Returning to operation 325, if the RSSI reading does not exceed TargetHigh, the iteration counter is incremented by one and the process then ends.

Figure 4:
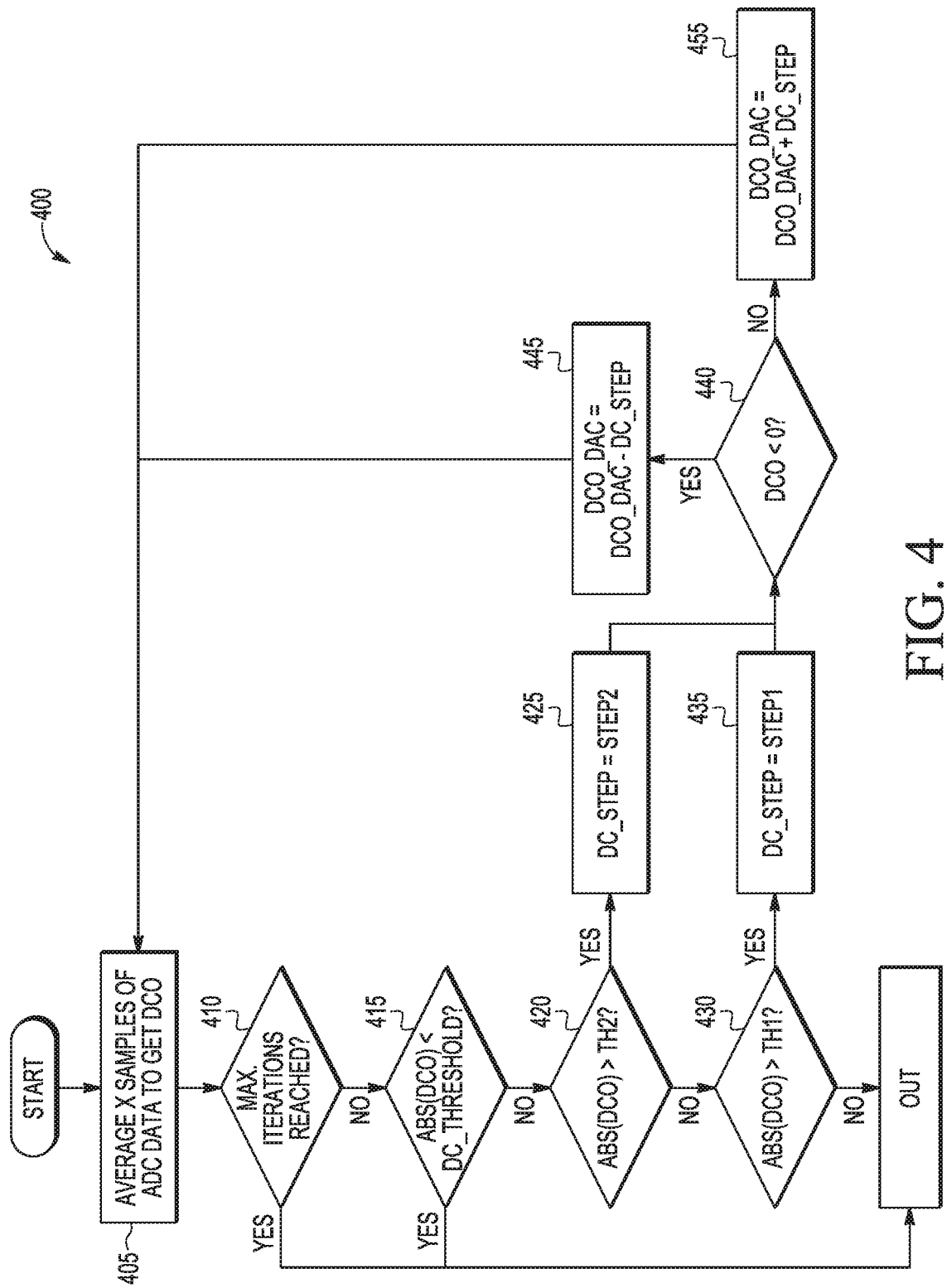
Figure 5:
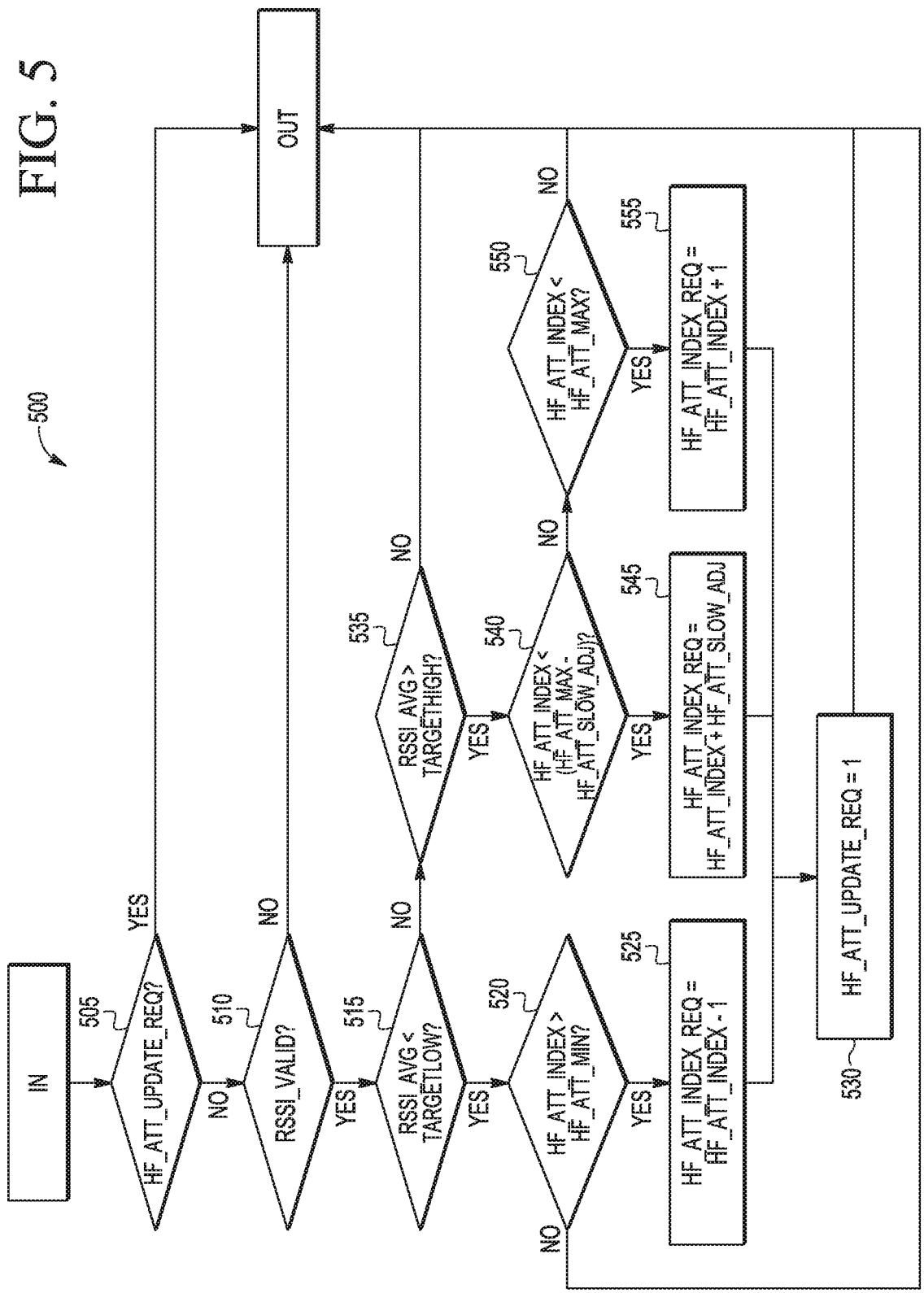

In other embodiments, the adjustment step size may be selected from a number of adjustment step sizes based on one or more thresholds defined at various RSSI levels or attenuation code values, in a manner similar to selection of the appropriate step size to adjust the DCO-DAC input code in FIG. 4, or in a manner similar to selection of the appropriate step size to adjust the attenuation code in FIG. 5. For example, a larger adjustment step size to adjust the attenuation code may be appropriate when the RSSI reading is much greater than TargetHigh, which quickly reduces the difference between the present RSSI reading and TargetHigh (e.g., a smaller step size may require multiple iterations to reduce the difference, as compared with a large step size that requires fewer iterations to do the same, using less time to adjust the attenuation code). The number of thresholds, the threshold levels, and the adjustment step sizes are all programmable values, and may be chosen to reduce the number of iterations required to bring the RSSI reading within the target range between TargetLow and TargetHigh.

FIG. 4 shows an example process flowchart 400 for DCO-DAC (Fast Mode) state 215 to adjust an input code for a DCO-DAC. Operations similar to those shown in FIG. 4 may also be performed in state 230, as discussed below. An iteration counter may be initialized to zero before beginning the process 400 (e.g., on startup or reset of the receiver). The process is performed for both the I channel DCO-DAC 118 and the Q channel DCO-DAC 122, which may be performed concurrently by separate control blocks in Gain/DCO control 138. The input code dco_dac discussed herein represents dco_dac_i when process 400 is performed for the I channel, and represents dco_dac_q when process is performed for the Q channel.

The process begins at operation 405, where Gain/DCO control 138 averages an X number of samples of ADC data (such as samples of signal adc_data_i 142 for the I channel or adc_data_q 144 for the Q channel) to calculate an estimated DC offset, where X is a programmable integer value (which need not be the same value of X used for RSSI samples). The process then continues to operation 410, where Gain/DCO control 138 determines whether a maximum number of iterations of executing the process shown in FIG. 4 has been reached, such as by comparing a present value of the iteration counter with a programmable maximum value. If so, the process then ends. If not, the process continues to operation 415, where Gain/DCO control 138 determines whether an absolute value of residual DC offset is less than DC_Threshold, which is a programmable minimum threshold. If so, the process then ends. If not, the process continues to operation 420.

In operation 420 (and in operation 430), Gain/DCO control 138 uses two programmable thresholds, TH1 and TH2, to determine an appropriate adjustment step size. Threshold TH1 is set at some DC offset level greater than DC_Threshold and Threshold TH2 is set at a DC offset level greater than both TH1 and DC_Threshold. TH1 serves as a smaller threshold associated with a smaller adjustment step size Step1 (e.g., 1 or 5), and TH2 serves as a larger threshold associated with a larger adjustment step size Step 2 (e.g., 5 or 10). Both Step1 and Step2 are programmable integer values.

Gain/DCO control 138 determines whether the absolute value of the DC offset is greater than larger threshold TH2. If so, this indicates that the magnitude of the DC offset is much larger than DC_Threshold and requires the corresponding large adjustment step size Step2 to quickly reduce the difference between the present DCO correction signal and the DC offset (e.g., a smaller step size may require multiple iterations to reduce the difference, as compared with a large step size that requires fewer iterations to do the same, using less time to adjust the input code). The process continues to operation 425 where an adjustment step variable (or dc_step) is assigned the value of Step2. Returning to step 420, if the absolute value of the DC offset is not greater than threshold TH2, the process continues to operation 430, where Gain/DCO control 138 determines whether the absolute value of the DC offset is larger than smaller threshold TH1. If so, this indicates that smaller adjustment step size Step1 should be used, and the adjustment step variable dc_step is assigned the small step size of Step1 in operation 435.

Both operations 425 and 435 continue to operation 440, where Gain/DCO control 138 determines whether the DC offset has a negative value. If not, the DC offset has a positive value that indicates the DCO-DAC is outputting a DCO correction signal that is too weak (e.g., the input code is too small), and the process continues to operation 455 where the input code dco_dac is increased by the adjustment step size of dc_step (or dco_dac+dc_step). The iteration counter is incremented by one, and the process continues to operation 405 to continue monitoring the DC offset. Returning to operation 440, if the DC offset has a negative value, then the DCO-DAC is outputting a DCO correction signal that is too strong (e.g., the input code is too large), and the process continues to operation 445, where the input code dco_dac is decreased by the adjustment step size of dc_step (or dco_dac−dc_step). The iteration counter is incremented by one, and the process continues to operation 405 to continue monitoring the DC offset.

In other embodiments, fewer or additional thresholds may be defined at various DC offset levels and may be used to determine an appropriate adjustment step size used to adjust the input code of the respective DCO-DAC. The number of thresholds, the threshold levels, and the adjustment step sizes are all programmable values, and may be chosen to reduce the number of iterations required to bring the DC offset within the DC_Threshold.

Additionally, Adjust DCO-DAC (Slow Mode) state 230 may be implemented using a subset of operations similar to those discussed in FIG. 4. As noted above, the residual DC offset is estimated for each I and Q channel by averaging an X number of samples of ADC data of the respective channel, which is estimated by Gain/DCO control 138 in an on-going or continuous basis in Tracking Before Frame state 220. In response to detection of the absolute value of the DC offset (in either the I or Q channel) exceeding DC_Threshold, Gain/DCO control 138 transitions from state 220 to state 230 to make an appropriate adjustment to one or both input codes of the DCO-DACs 118 and 122. If the residual DC offset has a negative value, Gain/DCO control 138 decrements the present input code by one (or dco_dac−1) to reduce the DCO correction signal output at the respective DCO-DAC (e.g., similar to operation 445 with dc_step equal to one). If the residual DC offset has a positive value, Gain/DCO control 138 increments the present input code by one (or dco_dac+1) to increase the DCO correction signal output at the respective DCO-DAC (e.g., similar to operation 455 with dc_step equal to one).

FIG. 5 shows an example process flowchart 500 for Adjust HF Attenuator (Slow Mode) state 225 to adjust an attenuator code for HF attenuator 104. As noted above, in some embodiments, the RSSI reading is an average of an X number of samples of RSSI 140. In some embodiments, the RSSI reading is averaged by Gain/DCO control 138 in an on-going or continuous basis in Tracking Before Frame state 220. In response to detection of the RSSI reading having a value greater than TargetHigh or a value less than TargetLow, Gain/DCO control 138 transitions from state 220 to state 225 to make an appropriate adjustment to the attenuator code.

The process 500 begins at operation 505, where Gain/DCO control 138 determines whether there is an outstanding pending request to update the attenuation code for HF attenuator 104, as indicated by pending signal hf_att_update_req. As noted above, the attenuation code for the HF attenuator 104 cannot be updated while the freeze signal is logic high. If the Gain/DCO control 138 determines that the attenuation code needs to be updated, Gain/DCO control 138 logs the attenuation code update as a pending request and sets the pending signal to logic high. If the freeze signal is logic low when the pending request is received (e.g., by a control block within Gain/DCO control 138 that monitors the freeze signal), the pending request is implemented by updating the attenuation code (e.g., ht_att_index is set to the requested code value), and the pending signal is cleared. If the freeze signal is logic high when the pending request is received, the pending request is not implemented (e.g., the attenuation code is not updated) until the freeze signal goes logic low. In operation 505, if the pending signal is determined to be logic high, Gain/DCO control 138 does not need to continue determining any further changes to the attenuation code since the attenuator code cannot be adjusted at this time, and the process then ends. In some embodiments, Gain/DCO control 138 may stop calculating the RSSI reading while the pending signal is logic high.

If the pending signal is determined to be logic low, the process continues to operation 510, where Gain/DCO 138 determines whether the RSSI reading is valid. If the RSSI reading is not valid (e.g., fewer than the X number of RSSI samples have been averaged), the process ends. If the RSSI reading is valid (e.g., the proper number of X samples have been averaged), the process continues to operation 515, where Gain/DCO control 138 determines whether the RSSI reading (or rssi_avg) is less than TargetLow. If so, the process continues to operation 520, where Gain/DCO control 138 then determines whether the present attenuation code (or hf_att_index) has a greater value than the minimum attenuation code (or hf_att_min) of the HF attenuator 104. If not, no further reduction to the present attenuation code can be made, and the process then ends. If the present attenuation code is greater than the minimum attenuation code, the process continues to operation 525, where Gain/DCO control 138 logs a request to decrement the present attenuation code by one, such as by setting a requested attenuation code variable (or hf_att_index_req) to the desired code value. The process continues to operation 530, where the pending signal is set to logic high, and the process then ends.

Returning to operation 515, if the RSSI reading is not less than TargetLow, the process continues to operation 535, where Gain/DCO control 138 determines whether the RSSI reading (or rssi_avg) is greater than TargetHigh. If not, the process then ends. If so, the process continues to operation 540, where Gain/DCO control 138 determines whether the present attenuation code (or hf_att_index) is less than the difference between the maximum attenuation code (or hf_att_max) of the HF attenuator 104 and a slow adjustment step size (or hf_att_slow_adj), where the slow adjustment step size is a programmable integer value larger than one. If so, the process continues to operation 545, where Gain/DCO control 138 logs a request to increase the present attenuation code by the slow adjustment step size in order to quickly attenuate the signal and bring down the RSSI to avoid saturation of the analog front-end architecture. The process then continues to operation 530, where the pending signal is set to logic high, and then ends.

Returning to operation 540, if the present attenuation code is not less than the difference (indicating that a smaller step size is needed), the process continues to operation 550, where Gain/DCO control 138 determines whether the present attenuation code (or hf_att_index) is less than the maximum attenuation code (or hf_att_max). If not, no further increase to the present attenuation code can be made, and the process ends. If the present attenuation code is less than the maximum attenuation code, the process continues to operation 555, where Gain/DCO control 138 logs a request to increment the present attenuation code by one. The process continues to operation 530, where the pending signal is set to logic high, and then ends.

In other embodiments, fewer or additional thresholds may be defined at various RSSI levels or attenuation code values and may be used to determine an appropriate adjustment step size used to adjust the attenuation code for the HF attenuator 104. The number of thresholds, the threshold levels, and the adjustment step sizes are all programmable values, and may be chosen to reduce the number of iterations required to adjust attenuation of the signal and bring the RSSI reading within the target range between TargetLow and TargetHigh.

Figure 6:
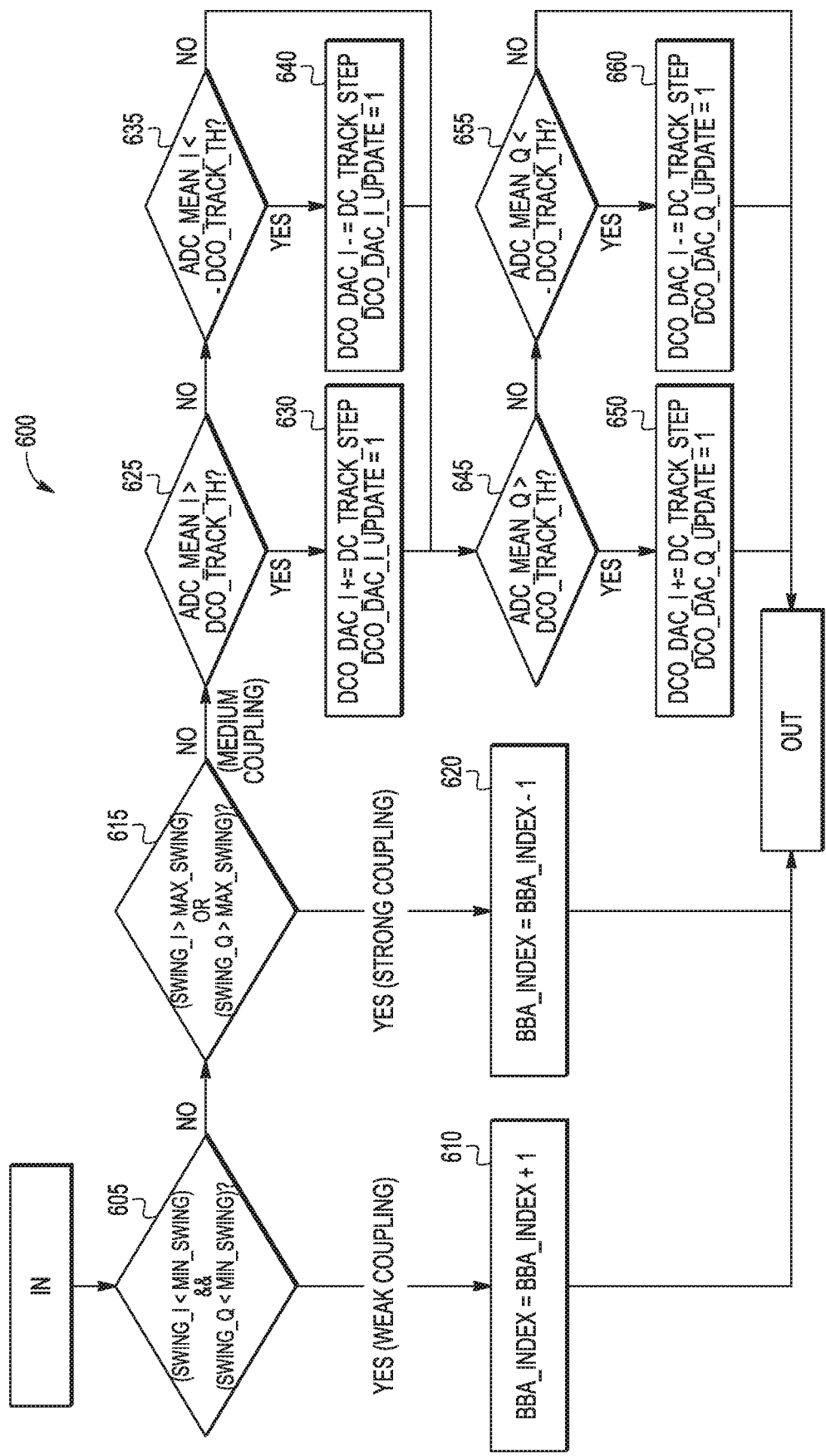

FIG. 6 shows an example process flowchart 600 for Gain & DCO Tracking During Frame state 240 to adjust a gain code for BBA 126 and 128 or to adjust an input code for DCO-DAC 118 and 122. In some embodiments, Gain/DCO control 138 is configured to calculate a swing value for each of the I and Q channels (or swing_i and swing_q) in an on-going or continuous basis during state 240, which may be used to determine whether the coupling between the receiver and a tag is weak, medium, or strong, and in response, the gain code may be adjusted as needed. Gain/DCO control 138 monitors the ADC data for each of the I and Q channels and tracks an average of the maximum ADC data values (or adc_max_avg_i and adc_max_avg_q) and tracks an average of the minimum ADC data values (or adc_min_avg_i and adc_min_avg_q) for each of the I and Q channels. In some embodiments, the average maximum and average minimum ADC data values are calculated over an integer number of sub-carrier cycles for BPSK modulation schemes, and at least one bit period plus one sub-carrier period for OOK modulation schemes.

The swing value is calculated as the difference between the average maximum and average minimum ADC values:

swing_$i$=adc_max_avg_$i$−adc_min_avg_$i$; and swing_$q$=adc_max_avg_$q$−adc_min_avg_$q$.

A mean value of the load modulation (or adc_mean_i and adc_mean_q) is also calculated for each of the I and Q channels in an on-going or continuous basis during state 240. The mean value corresponds to the DC offset, which is proportional to the load modulation amplitude. The mean value is calculated as the mean of the average maximum and average minimum ADC values:

adc_mean_$i$=[adc_max_avg_$i$+adc_min_avg_$i$]/2; and adc_mean_$q$=[adc_max_avg_$q$+adc_min_avg_$q$]/2.

The process 600 begins at operation 605, where Gain/DCO control 138 determines whether both of the swing values of the I and Q channels are less than a programmable minimum swing value (or min_swing). If so, weak coupling is indicated, and the process continues to operation 610, where the present gain code is incremented by one (or bba_index+1), and the process then ends. If not, the process continues to operation 615, where Gain/DCO control 138 determines whether at least one of the swing values of the I and Q channels are greater than a programmable maximum swing value (or max_swing). If so, strong coupling is indicated, and the process continues to operation 620, where the present gain code is decremented by one (or bba_index−1), and the process then ends.

If none of the swing values are greater than max_swing, medium coupling is indicated, and the process continues to operation 625 to begin adjusting one or more input codes for DCO-DACs 118 and 122, if needed. In operation 625, Gain/DCO control 138 determines whether the mean value for I channel (or adc_mean_i) is greater than a programmable DC offset threshold (or dco_track_th), which has a positive value. In some embodiments, the threshold dco_track_th corresponds to the same DC offset value as DC_Threshold (shown in FIG. 4), or may correspond to a DC offset value that is greater or less than DC_Threshold in other embodiments. If adc_mean_i is greater than dco_track_th, the process continues to operation 630, where the input code for DCO-DAC 118 in the I channel (or dco_dac_i) is incremented by a programmable adjustment step size (or dc_track_step). In some embodiments, the step size dc_track_step is the same value as dc_step (shown in FIG. 4). An update signal dco_dac_i_update may also be set to logic high or 1 in operation 630 to indicate that the input code for DCO-DAC 118 has been updated, which may be used to indicate when a compensation signal is generated, as further discussed below in connection with FIG. 7.

Returning to operation 625, if adc_mean_i is not greater than dco_track_th, the process continues to operation 635, where Gain/DCO control 138 determines whether adc_mean_i is less than a negative version of dco_track_th. If so, the process continues to operation 640, where the input code dco_dac_i is decremented by dc_track_step. In some embodiments, the update signal dco_dac_i_update may also be set logic high. If adc_mean_i is not less than a negative version of dco_track_th, this indicates that the residual DC offset remains below the minimum threshold and no adjustment is needed.

Both operations 630 and 640 continue to operation 645, where Gain/DCO determines whether the mean value for Q channel (or adc_mean_q) is greater than dco_track_th. If so, the process continues to operation 650, where the input code for DCO-DAC 122 in the Q channel (or dco_dac_q) is incremented by dc_track_step. In some embodiments, an update signal dco_dac_q_update may also be set logic high to indicate that the input code for DCO_DAC 122 has been updated. The process then ends. Retuning to operation 645, if adc_mean_q is not greater than dco_track_th, the process continues to operation 655, where Gain/DCO control 138 determines whether adc_mean_q is less than a negative version of dco_track_th. If so, the process continues to operation 660, where the input code dco_dac_q is decremented by dc_track_step. In some embodiments, the update signal dco_dac_q_update may also be set to logic high. The process then ends. If adc_mean_q is not less than a negative version of dco_track_th, this indicates that the residual DC offset remains below the minimum threshold and no adjustment is needed, and the process ends.

Figure 7:
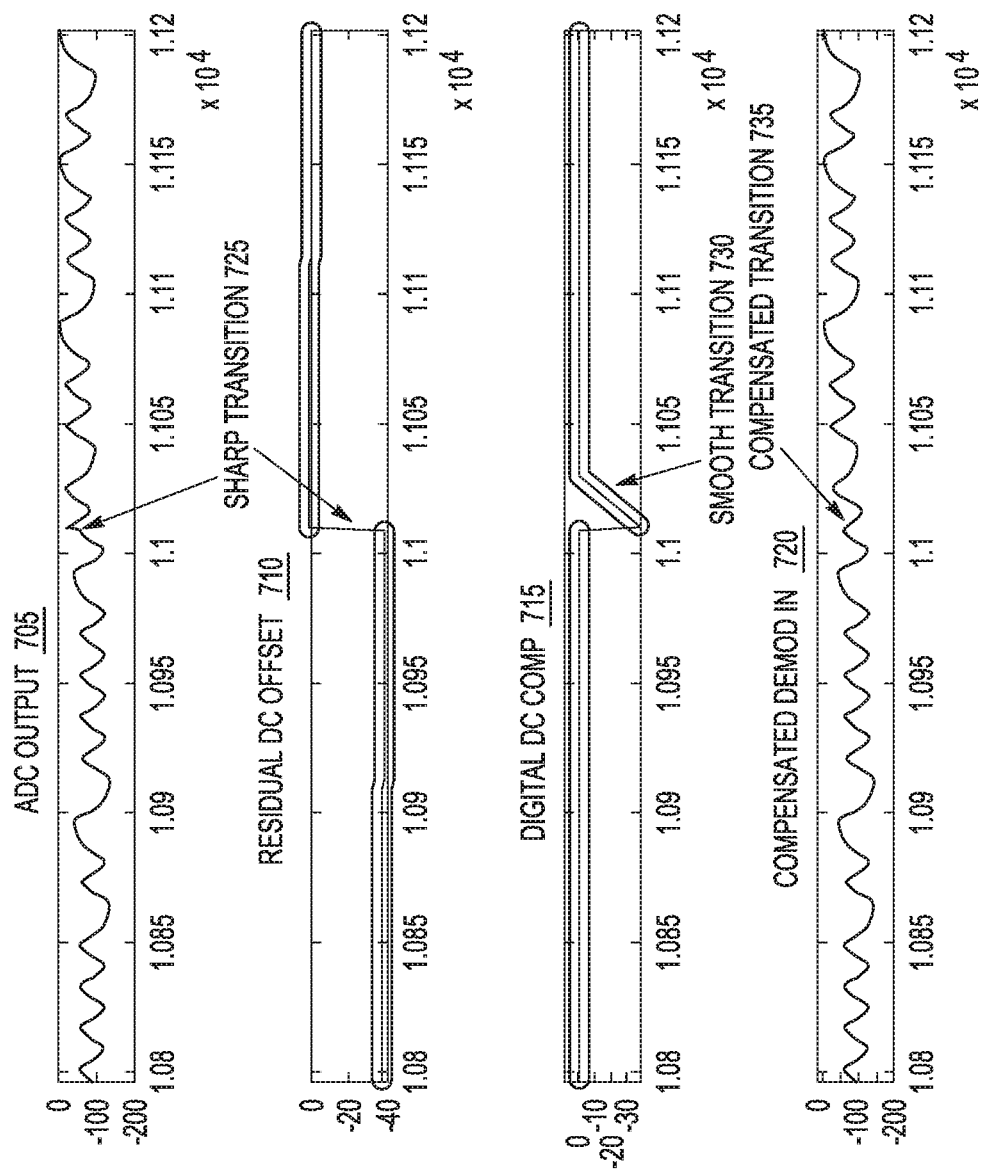
FIG. 7 illustrates waveforms of example signals present in the receiver system that implements the adaptive gain and DC control solution according to some embodiments of the present disclosure.

FIG. 7 illustrates waveforms of example signals in the receiver at points before and after the DC Step and Gain Compensation Unit (Compensation Unit) 134. FIG. 7 shows ADC output 705 for a channel (such as at the output of ADC 130 or 132) and residual DC offset 710 for that same channel, where a sharp transition 725 occurs in the residual DC offset 710 due to an adjustment made to one or more of the input codes or gain code, which can also be seen in the ADC output 705. Compensation Unit 134 is configured to generate a digital DC compensation signal 715 that is added to the ADC output 705, resulting in a smoother compensated demodulated signal 720, which may be provided to DSP 136 for further processing. Compensation Unit 134 generates a respective digital DC compensation signal 715 for the I and Q channels, based on information provided by Gain/DCO control 138.

Gain/DCO control 138 is configured to determine a DC step change in both the I and Q channels by taking the difference of two consecutive samples of the ADC data, one sample before the abrupt change, and one sample after the abrupt change. Gain/DCO control 138 provides the value of the ADC data difference in the I channel as dc_step_i 152, and provides the value of the ADC data difference in the Q channel as dc_step_q 154 to Compensation Unit 134. Compensation Unit 134 generates a signal that initially cancels out the ADC data difference and gradually ramps down to zero over some amount of time, providing a smooth transition 730. By adding this signal to the ADC output 705, the sharp transition 725 is smoothed out to provide a compensated transition 735.

In some embodiments, Gain/DCO control 138 may be configured to determine the DC step change in the I channel in response to the update signal dco_dac_i_update going logic high, which indicates that the input code for DCO-DAC 118 has been updated and that the DC offset is about to change. For example, in response to the update signal going high, Gain/DCO control 138 uses a present sample taken (e.g., presently stored in a sample buffer) should be used as the sample before the abrupt change, and a next sample that will be taken should be used as the sample after the abrupt change. Similarly, in some embodiments Gain/DCO control 138 may be configured to determine the DC step change in the Q channel in response to the update signal dco_dac_q_update going high. In both cases, Gain/DCO control 138 may also be configured to stop calculating or determining the DC step when the respective update signal is logic low. In other embodiments, Gain/DCO control 138 may continuously determine the DC step change for both I and Q channels, and instead may only provide the respective value of the DC step changes to Compensation Unit 134 when the respective update signal is logic high. In still other embodiments, the update signals may be directly provided to Compensation Unit 134, which is triggered to generate a compensation signal based on a respective DC step change in response to the respective update signal going high. In all embodiments that implement the update signals, once generation of the compensation signal is triggered by a logic high update signal, the update signal is then cleared or set to logic low.

Gain/DCO control 138 may also generate gain_shift 156 to indicate a scaling factor for signal compensation. For example, if Gain/DCO control 138 reduces the BBA gain setting by a factor of 2, the amplitude of the resulting analog signal is decreased by a factor of 2. In order to maintain the signal amplitude within a desired range, Gain/DCO control 138 provides the scaling factor gain_shift to Compensation Unit 134 that is the inverse of the change in BBA gain setting. Continuing the example, Gain/DCO control 138 would indicate that the Compensation Unit 134 should provide digital compensation by scaling up the digital signal by a factor of 2. Such compensation provides a normalized signal, or a signal having a signal amplitude within the desired range for proper demodulation. Similarly, if the BBA setting is increased by a factor of 2, the signal may be scaled down by a factor of 2. The scaling factor is used to provide continued scaling of the digital signal while receiving the remainder of the signal or frame. The scaling factor may continue to be adjusted (e.g., increased or decreased) in response to each change in the BBA gain. In some embodiments, Compensation Unit 134 may implement a bit shifter to scale the signal up or down, such as shifting the bits left or right based on the gain factor indicated by gain_shift.

By now it should be appreciated that there has been provided an adaptive gain and DC control solution implemented in a receiver, which tracks changes of a carrier amplitude and load modulation amplitude and adapts settings of the receiver as needed, depending on whether the receiver is waiting for a frame to be received or is receiving the frame. In some embodiments, the control circuitry that implements such an adaptive gain and DC control solution may control the attenuation setting of a high frequency attenuator, the setting of DCO correction circuitry for the I and Q channels in an independent manner, and the gain setting of baseband amplifiers for the I and Q channels.

In one embodiment of the present disclosure, a method for operating a receiver system is provided, the receiver system including one or more channels, the method including:

monitoring a residual DC (direct current) offset in a present channel by sampling an output of an analog-to-digital converter (ADC) of the present channel; adjusting a DCO (direct current offset) correction signal that corresponds to the residual DC offset in response to an absolute value of the residual DC offset exceeding a programmable DCO threshold; and subtracting the DCO correction signal from an analog signal provided to the ADC to reduce the residual DC offset below the programmable DCO threshold.

One aspect of the above embodiment provides that the adjusting the DCO correction signal includes: in response to a combination of the absolute value of the residual DC offset exceeding the programmable DCO threshold and the residual DC offset having a positive value, increasing a correction setting of a digital-to-analog converter (DAC) configured to output the DCO correction signal, and in response to a combination of the absolute value of the residual DC offset exceeding the programmable DCO threshold and the residual DC offset having a negative value, decreasing the correction setting of the DAC.

A further aspect of the above embodiment provides that the DCO correction signal corresponds to a selected N-bit input code provided as the correction setting to the DAC, the increasing the correction setting includes adding a step value to a presently selected N-bit input code to provide a new selected N-bit input code for the correction setting, and the decreasing the correction setting includes subtracting the step value from the presently selected N-bit input code to provide the new selected N-bit input code for the correction setting.

Another aspect of the above embodiment provides that the method further includes: estimating the residual DC offset by averaging an X number of samples of the output of the ADC, wherein X is an integer value greater than one.

Another aspect of the above embodiment provides that the monitoring the residual DC offset, the adjusting the DCO correction signal, and the subtracting the DCO correction signal are performed in each channel independently of other channels.

Another aspect of the above embodiment provides that the monitoring the residual DC offset is performed continuously while waiting for receipt of a valid frame.

Another aspect of the above embodiment provides that the monitoring the residual DC offset is performed continuously while a valid frame is being received.

A further aspect of the above embodiment provides that the method further includes: calculating an average maximum ADC value of samples of the output of the ADC; calculating an average minimum ADC value of the samples of the output of the ADC; and estimating the residual DC offset by calculating a mean value of the average maximum ADC value and the average ADC minimum value.

Another further aspect of the above embodiment provides that the method further includes: calculating a difference between two consecutive samples of the output of the ADC, wherein a first sample is taken before an adjustment is made to the correction setting, and a second sample is taken after the adjustment is made to the correction setting; generating a digital compensation signal that initially cancels out the difference and gradually ramps down to zero; and adding the digital compensation signal to a digital signal output by the ADC to provide a compensated signal with smoother transitions.

A still further aspect of the above embodiment provides that the digital compensation signal is generated in response to an update signal that is set high when the adjustment to the correction setting is made.

Another aspect of the above embodiment provides that the method further includes: monitoring a received signal strength indicator (RSSI) reading of an output of a high frequency (HF) attenuator of the receiver system; and adjusting an attenuation setting of the HF attenuator in response to the RSSI reading falling outside of a desired range defined by a programmable floor threshold and a programmable ceiling threshold.

A further aspect of the above embodiment provides that the adjusting the attenuation setting includes: in response to the RSSI reading being less than the programmable floor threshold, decreasing an attenuation setting of the HF attenuator, and in response to the RSSI reading being larger than the programmable ceiling threshold, increasing the attenuation setting of the HF attenuator.

Another further aspect of the above embodiment provides that the method further includes: estimating the RSSI reading by averaging an X number of RSSI values, X being an integer value greater than one.

Another further aspect of the above embodiment provides that the method further includes: the monitoring the RSSI reading is performed continuously while waiting for receipt of a valid frame.

Another further aspect of the above embodiment provides that the adjusting the attenuation setting includes: logging an adjustment to the attenuation setting as a pending request, and implementing the pending request in response to a freeze signal being set low, wherein the freeze signal is set high for a period of time during which a valid frame is expected to be received, and the pending request remains pending while the freeze signal is set high.

Another further aspect of the above embodiment provides that the monitoring the residual DC offset is performed each time after the attenuation setting is changed.

Another aspect of the above embodiment provides that the method further includes: monitoring a swing value of the output of the ADC; and adjusting a gain setting of an amplifier that amplifies the analog signal of the present channel, in response to the swing value falling outside of a desired range defined by a programmable minimum threshold and a programmable maximum threshold.

A further aspect of the above embodiment provides that the method further includes: calculating a respective swing value for each channel, wherein each respective swing value is a difference between the average maximum ADC value and the average minimum ADC value calculated for the channel.

A still further aspect of the above embodiment provides that the adjusting the gain setting includes: increasing the gain setting in all channels in response to all respective swing values of the one or more channels being less than the programmable minimum threshold, and decreasing the gain setting in all channels in response to at least one of the respective swing values being greater than the programmable maximum threshold.

Another further aspect of the above embodiment provides that the monitoring the swing value is performed continuously while a valid frame is being received.

Another further aspect of the above embodiment provides that the method further includes: scaling a digital signal output by the ADC by a scaling factor to produce a scaled signal with smoother transitions, wherein the scaling factor is inversely proportional to a gain adjustment factor based on an adjustment made to the gain setting.

The circuitry described herein may be implemented on a semiconductor substrate, which can be any semiconductor material or combinations of materials, such as gallium arsenide, silicon germanium, silicon-on-insulator (SOI), silicon, monocrystalline silicon, the like, and combinations of the above.

In one embodiment, the illustrated elements of receiver system 100 are circuitry located on a single integrated circuit or within a same device. In other embodiments, receiver system 100 may include any number of separate integrated circuits or separate devices interconnected with each other. For example, BBA 126 and 128 may be located on a same integrated circuit that is separate from an integrated circuit that includes ADC 130 and 132, both of which may be attached to a single substrate or printed circuit board (PCB) as part of a single device.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common mode).

The following description refers to nodes or features being "connected" or "coupled" together. As used herein, unless expressly stated otherwise, "coupled" means that one node or feature is directly or indirectly joined to (or is in direct or indirect communication with) another node or feature, and not necessarily physically. As used herein, unless expressly stated otherwise, "connected" means that one node or feature is directly joined to (or is in direct communication with) another node of feature. For example, a switch may be "coupled to a plurality of nodes, but all of those nodes need not always be "connected" to each other; the switch may connect different nodes to each other depending upon the state of the switch. Furthermore, although the various schematics shown herein depict certain example arrangements of elements, additional intervening elements, devices, features, or components may be present in an actual embodiment (assuming that the functionality of the given circuit is not adversely affected).

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

As used herein, the terms "substantial" and "substantially" mean sufficient to achieve the stated purpose or value in a practical manner, taking into account any minor imperfections or deviations, if any, that arise from usual and expected abnormalities that may occur during receiver operation, which are not significant for the stated purpose or value.

Although the invention is described herein with reference to specific embodiments, various modifications and changes can be made without departing from the scope of the present invention as set forth in the claims below. For example, additional or fewer stages may be implemented in the receiver FIG. 1. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method for operating a receiver system, the receiver system comprising one or more channels, the method comprising:
    monitoring an output of an analog-to-digital converter (ADC); and
    adaptively controlling a gain setting and a DCO (direct current offset) correction signal for the receiver system in response to the output of the ADC by:
        (1) increasing the gain setting in all channels in response to all respective swing values of the one or more channels being less than a programmable minimum threshold, and decreasing the gain setting in all channels in response to at least one of the respective swing values being greater than a programmable maximum threshold; and
        (2) adjusting the DCO correction signal that corresponds to a residual DC offset in a present channel in response to an absolute value of the residual DC offset exceeding a programmable DCO threshold, and subtracting the DCO correction signal from an analog signal provided to the ADC to reduce the residual DC offset below the programmable DCO threshold.

2. The method of claim 1, wherein
    the adjusting the DCO correction signal comprises:
    in response to a combination of the absolute value of the residual DC offset exceeding the programmable DCO threshold and the residual DC offset having a positive value, increasing a correction setting of a digital-to-analog converter (DAC) configured to output the DCO correction signal, and
    in response to a combination of the absolute value of the residual DC offset exceeding the programmable DCO threshold and the residual DC offset having a negative value, decreasing the correction setting of the DAC.

3. The method of claim 2, wherein
    the DCO correction signal corresponds to a selected N-bit input code provided as the correction setting to the DAC, the increasing the correction setting comprises adding a step value to a presently selected N-bit input code to provide a new selected N-bit input code for the correction setting, and the decreasing the correction setting comprises subtracting the step value from the presently selected N-bit input code to provide the new selected N-bit input code for the correction setting.

4. The method of claim 1, further comprising:

estimating the residual DC offset by averaging an X number of samples of the output of the ADC, wherein X is an integer value greater than one.

5. The method of claim 1, wherein the monitoring the output of the ADC, the adjusting the DCO correction signal, and the subtracting the DCO correction signal are performed in each channel independently of other channels.

6. The method of claim 1, wherein the adjusting the DCO correction signal is performed continuously while waiting for receipt of a valid frame.

7. The method of claim 1, wherein the adjusting the DCO correction signal is performed continuously while a valid frame is being received.

8. The method of claim 7, further comprising:

calculating an average maximum ADC value of samples of the output of the ADC;

calculating an average minimum ADC value of the samples of the output of the ADC; and estimating the residual DC offset by calculating a mean value of the average maximum ADC value and the average ADC minimum value.

9. The method of claim 8, further comprising:

monitoring a swing value of the output of the ADC; and adjusting the gain setting, in response to the swing value falling outside of a desired range defined by the programmable minimum threshold and the programmable maximum threshold.

10. The method of claim 9, further comprising:

calculating a respective swing value for each channel, wherein each respective swing value is a difference between the average maximum ADC value and the average minimum ADC value calculated for the channel.

11. The method of claim 9, wherein the monitoring the swing value is performed continuously while a valid frame is being received.

12. The method of claim 9, further comprising:

scaling a digital signal output by the ADC by a scaling factor to produce a scaled signal with smoother transitions, wherein the scaling factor is inversely proportional to a gain adjustment factor based on an adjustment made to the gain setting.

13. The method of claim 7, further comprising:

calculating a difference between two consecutive samples of the output of the ADC, wherein a first sample is taken before an adjustment is made to the correction setting, and a second sample is taken after the adjustment is made to the correction setting;

generating a digital compensation signal that initially cancels out the difference and gradually ramps down to zero; and adding the digital compensation signal to a digital signal output by the ADC to provide a compensated signal with smoother transitions.

14. The method of claim 13, wherein the digital compensation signal is generated in response to an update signal that is set high when the adjustment to the correction setting is made.

15. A method for operating a receiver system, the receiver system comprising one or more channels, the method comprising:

continuously monitoring a residual DC (direct current) offset in a present channel while a valid frame is being received by sampling an output of an analog-to-digital converter (ADC) of the present channel;

calculating an average maximum ADC value of samples of the output of the ADC;

calculating an average minimum ADC value of the samples of the output of the ADC;

estimating the residual DC offset by calculating a mean value of the average maximum ADC value and the average ADC minimum value;

calculating, for each channel, a respective swing value of the output of the ADC, wherein each respective swing value is a difference between the average maximum ADC value and the average minimum ADC value calculated for the channel;

adjusting a gain setting of an amplifier that amplifies the analog signal of the present channel, in response to the swing value falling outside of a desired range defined by a programmable minimum threshold and a programmable maximum threshold, by:

increasing the gain setting in all channels in response to all respective swing values of the one or more channels being less than the programmable minimum threshold, and decreasing the gain setting in all channels in response to at least one of the respective swing values being greater than the programmable maximum threshold;

adjusting a DCO (direct current offset) correction signal that corresponds to the residual DC offset in response to an absolute value of the residual DC offset exceeding a programmable DCO threshold; and subtracting the DCO correction signal from an analog signal provided to the ADC to reduce the residual DC offset below the programmable DCO threshold.

* * * * *